United States Patent [19]

Tamura

[11] Patent Number: 5,106,822

[45] Date of Patent: Apr. 21, 1992

[54] TRANSISTOR WITH SUPERCONDUCTING COLLECTOR, BASE, AND EMITTER SEPARATED BY NON-SUPERCONDUCTING BARRIER LAYERS

[75] Inventor: Hirotaka Tamura, Atsugi, Japan

[73] Assignee: Fujitsu Limited, Kawasaki, Japan

[21] Appl. No.: 397,506

[22] Filed: Aug. 23, 1989

[30] Foreign Application Priority Data

Aug. 29, 1988 [JP] Japan .................. 63-212566

[51] Int. Cl.$^5$ .................. H01L 39/22; H01L 29/00; H01B 12/00
[52] U.S. Cl. .................. 505/1; 357/5; 357/33; 505/700; 505/701; 505/702
[58] Field of Search .................. 357/4, 5, 6; 505/1, 505/700, 701; 427/62, 63

[56] References Cited

U.S. PATENT DOCUMENTS

| 4,157,555 | 6/1979 | Gray | 357/6 |
| 4,575,741 | 3/1986 | Frank | 357/5 |

FOREIGN PATENT DOCUMENTS

| 0324044 | 7/1989 | European Pat. Off. | 357/5 |
| 57-27079 | 2/1982 | Japan . | |
| 61-73391 | 4/1986 | Japan | 357/5 |

OTHER PUBLICATIONS

"Temperature and Composition Dependence of the Tetragonal Orthorhmbic Distortion in LA2-x Srx CuO4-δ", Fleming et al., Physical Review B, vol. 35, #13, 1 May 1987, pp. 7191-7194.

"Neutron Study of the Crystal Structure and Vacancy Distribution in the Superconductor Ba2YCu3 O9-δ", Beech et al., Physical Review B, vol. 35, #16, 1 Jun. 1987, pp. 8778-8781.

Patent Abstract of Japan, vol. 6, No. 95 (E-110) (973) Jun. 3, 1982; JP-A-57-27079, Feb. 13, 1982.

Patent Abstract of Japan, vol. 12, No. 3 (E-570) (2850) Jan. 7, 1988; JP-A-62-163379 Feb. 27, 1987.

Japanese Journal of Applied Physics, vol. 26, No. 7, part II, Jul. 1987, pp. L1211-L1213, Tokyo, JP, Y. Higashino et al., "Observation of the Josephson Effect in Y-Ba-Cu-O Compound".

Patent Abstracts of Japan, vol. 13, No. 254 (E-772) (3602) Jun. 13, 1989; JP-A-1-51680 Feb. 27, 1989.

International Electron Devices Meeting 11-14th Dec. 1988, pp. 282-285, New York, U.S., A. Yoshida et al., "Monolithic Device Fabrication Using High-Tc Superconductor".

*Primary Examiner*—Rolf Hille
*Assistant Examiner*—Mahshid Saadat
*Attorney, Agent, or Firm*—Staas & Halsey

[57] ABSTRACT

A superconducting transistor comprises: a superconducting collector layer for drawing out quasiparticles from a superconducting base layer while a carrier concentration thereof is maintained at a level lower than in metal and at a high level where the superconducting property, is exhibited said superconducting collector layer being formed of predetermined component elements which are formed by a predetermined composition rate, a first barrier layer provided on the superconducting collector layer, formed of a substance having the same component elements as that of the collector layer and having different composition rate from that of the collector layer, and said first barrier layer having a low carrier concentration where the superconducting property is not exhibited, a superconducting base layer provided on the first barrier layer, formed of a substance having the same component elements as that of the superconducting collector layer, a second barrier layer provided on the superconducting base layer formed of a substance having the same component element as that of the superconducting collector layer and having different composition rate from that of the superconducting collector layer, and having a low carrier concentration where the superconducting properties is not exhibited, and a superconducting emitter layer provided on the second barrier layer, formed of a substance having the same component elements as that of the superconducting collector.

8 Claims, 3 Drawing Sheets

TRANSISTOR WITH SUPERCONDUCTING COLLECTOR, BASE, AND EMITTER SEPARATED BY NON-SUPERCONDUCTING BARRIER LAYERS

BACKGROUND OF THE INVENTION

1. Field of the Invention

The present invention relates to a superconducting transistor, and more particularly, to a superconducting transistor in which each emitter, base and collector layer are formed by the same high temperature superconductor.

2. Description of the Related Art

Recently, an oxide high temperature superconductor having a critical temperature (Tc) higher than the boiling point of nitrogen i.e. 77 [K], has been found and will be utilized in the field of electronics.

Although the well known Josephson junction used in the field of the electronics has the advantages of a high speed and low electric power consumption, this Josephson junction element is a two terminal element and thus can not be realized merely by circuitry.

Therefore, if a three terminal element using a superconducting phenomena; i.e., an element wherein a transistor operation is carried out, can be obtained, various functions can be preferably realized. If the three terminal element can be realized while using a high temperature superconductor, technologies in a number of fields would be advanced.

FIG. 1 is a cross-sectional side view of a conventional superconducting base transistor previously developed by the present inventors.

In FIG. 1, an n+ type InGaAs collector layer 22 having a thickness of 50 nm and an impurity concentration of $2 \times 10^{19}/cm^3$ is provided on a semi-insulating InP substrate 21. Further, provided on the collector layer 22, in the following order, are an n type InGaAs collector layer 23 having a thickness of 50 nm and an impurity concentration of $5 \times 10^{17}/cm^3$; an In $Al_{0.14}Ga_{0.86}$)As collector layer 24 having a thickness of 100 nm; an n type InGaAs collector 25 having a thickness of 10 nm and an impurity concentration of 5 ×3 an n+ type In-GaAs collector layer 26 having a thickness of 30 nm and an impurity concentration of $2 \times 10^{19}/cm^3$; an Nb superconducting base layer 27 having a thickness of 100 nm and formed by a magnetron sputtering process; an aluminum oxide (AlOx) tunneling barrier layer 28 having a thickness of 30 Å; and, an Nb emitter layer 29 having a thickness of 100 nm and formed by a magnetron sputtering process. Between the layers 27 and 28, an aluminum layer having a thickness of 30 Å is usually formed.

Further, an Nb collector contact layer 30 is provided on the collector layer 22, and an Nb emitter electrode 32, Nb base electrode 33 and Nb collector electrode 34 are connected to the Nb emitter layer 29, the superconducting base layer 27 and the Nb collector contact layer 30 respectively. Numeral 31 represents an insulating film of a silicon dioxide.

Further, non-doped InGaAs spacer layers are provided between the collector layers 23 and 24 and between the collector layers 24 and 25, although not shown in FIG. 1.

As shown in FIG. 1, in the superconducting base transistor, the collector is formed by a heterojunction of InGaAs/InAlGaAs.

When a voltage is supplied to cause a flow of current between the emitter layer 29 and the base layer 27, quasi-particles are injected into the base layer 27. A barrier having a height of the energy gap of a superconductor exists between the base layer 27 and the collector, and the injected quasi-particles pass through the barrier and flow into a collector. Superconducting leakage current passing through the collector can be stopped at the barrier.

Namely, the collector current is controlled by a current passing from the emitter to the base.

In the above-explained prior superconducting base transistor, a very small barrier must be reproducibly formed, this barrier having the same level as a superconducting gap existing between a collector consisting of a plurality of semiconductor layers and a superconducting base layer.

Generally, the interface between a semiconductor and a superconductor is unstable and an electrical barrier larger than the superconducting gap is easily formed. Consequently, due to the provision that the number of quasi-particles penetrating to the collector becomes small, a current gain can not be obtained. Further, it is difficult to establish contact between a superconducting layer and a semiconductor at a barrier height of an energy gap of a usual superconductor, e.g., about 1.5 meV.

SUMMARY OF THE INVENTION

An object of the present invention is to provide a superconducting transistor wherein an undesired barrier is not generated between a base and a collector and a current transfer ratio is improved.

Another object of the present invention is to provide a superconducting transistor wherein the reproducibility of the element properties is improved.

Therefore, according to the present invention, there is provided a superconducting transistor comprising: a superconducting collector layer for drawing out quasi-particles from a superconducting base layer while a carrier concentration is maintained at a level lower than in metal and at a high level where the superconducting property is exhibited said superconducting collector layer being formed of predetermined component elements which are formed by a predetermined composition rate., a first barrier layer provided on the superconducting collector layer, formed of a substance having the same component elements as that of the collector layer and having different composition rate from that of the collector layer, and said first barrier layer having a low carrier concentration where the superconducting property is not exhibited; a superconducting base layer provided on the first barrier layer, formed of a substance having the same component elements as that said superconducting collector layer, having different composition rate from that of the first barrier layer and having a high carrier concentration where the superconducting property is exhibited; a second barrier layer provided on the superconducting base layer formed of a substance having the same component element as that of the superconducting collector layer and having different composition rate from that of the super conducting collector layer and having a low concentration where the superconducting property is not exhibited, and a superconducting emitter layer provided on the second barrier layer, formed of a substance having the same component elements as that of said superconducting collector and said superconducting emitter layer, having different composition rate from that of the first and second barrier layers and having a high carrier concentration where the superconducting property is exhibited.

According to the present invention, the superconducting collector, base and emitter layers preferably have a carrier concentration of to $2\times 10^{21}$ to $2\times 10^{22}/cm^3$; the first barrier layer preferably has a carrier concentration of less than $2\times 10^{21}/cm^3$; and the second barrier layer preferably has a carrier concentration of less than $2\times 10^{21}/cm^3$.

DESCRIPTION OF THE PREFERRED EMBODIMENTS

The preferred embodiments of the invention will now be described.

Figure 1:
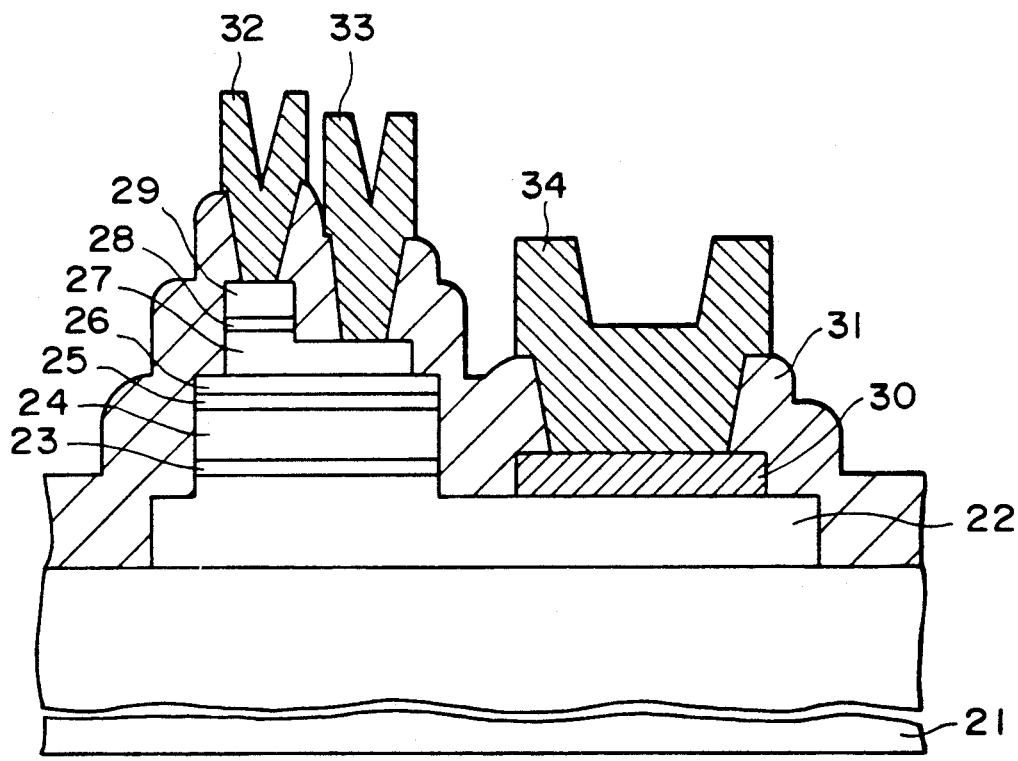
FIG. 1 is a cross-sectional side view of a conventional superconducting base transistor.
Figure 2:
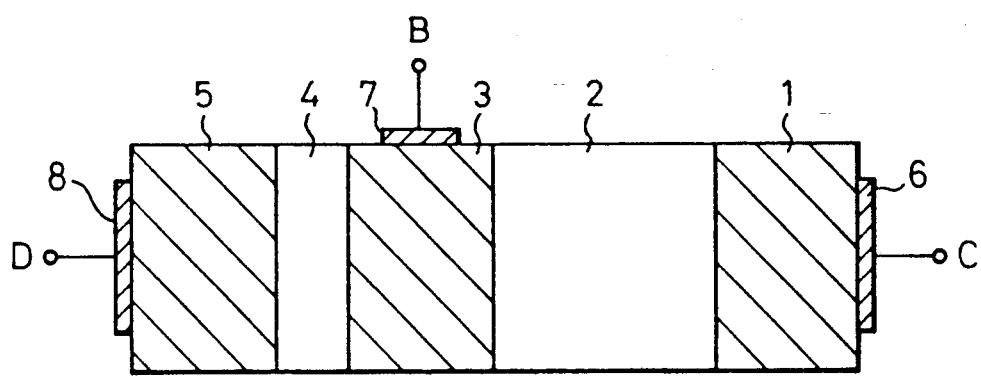
FIG. 2 is a schematic cross-sectional view of a main portion of a superconducting transistor for explaining the principle of the present invention.

FIG. 2 is a schematic cross-sectional view of a main portion of a superconducting transistor, for explaining the principle of the present invention.

In FIG. 2, an oxide barrier layer 2, an oxide superconducting base layer 3, an oxide barrier layer 4, and an oxide superconducting emitter layer 5 are provided in that order on an oxide superconducting collector layer 1, and a collector electrode 6, a base electrode 7 and an emitter electrode 8 are respectively connected to the oxide superconducting collector layer 1, the oxide superconducting base layer 3 and the oxide superconducting emitter layer 5.

The collector layer 1, the base layer 3 and the emitter layer 5 of the superconducting transistor shown in FIG. 2 exhibit a superconducting property at a operating temperature. Although barrier layers 2 and 4 consist of the same component oxide as that of the collector layer 1, base layer 3 and emitter layer 5, since the component ratios thereof are different, the concentrations of carriers which carry the superconducting current are different, and thus the barrier layers 2 and 4 do not exhibit the superconducting quality.

The oxide layers are ideally formed of a single crystal or have a similar crystal structure, and thus they can be regarded as the same component substance.

As explained above, in the superconducting transistor, all oxides are essentially formed by similar crystal structure substances and an electric barrier is not generated between the base layer 3 and the collector layer 1. Therefore, the current transfer ratio is high and the reproducibility of the element is good.

Figure 3:
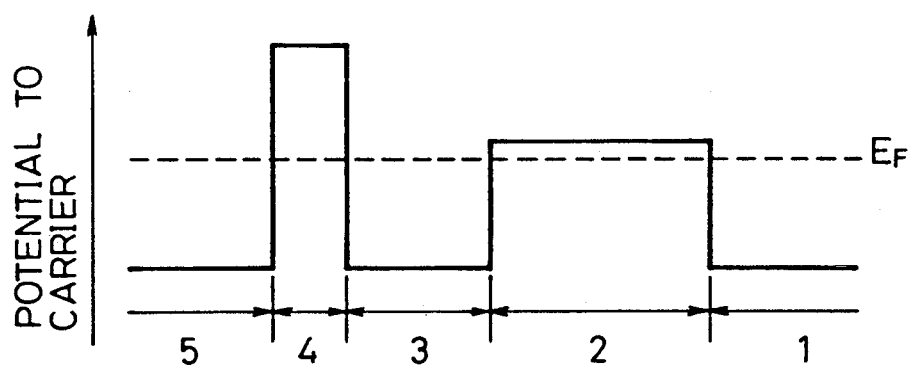
FIG. 3 is a potential diagram against a carrier in a superconducting transistor shown in FIG. 2; and, FIG. 4 is a cross-sectional view of an example of the present invention.

FIG. 3 shows a potential diagram against a carrier in a superconducting transistor shown in FIG. 2. The reference numerals of FIG. 3 show the same portions or have the same meanings as in FIG. 2.

As can be seen from FIG. 3, a potential change from the emitter layer 5 to the collector 1 is shown. Since a carrier concentration is high in the emitter layer 5, base layer 3 and the collector layer 1, compared to that of the barrier layers 4 and 2, the potential is maintained at a low level in the emitter layer 5, the base layer 3 and the collector layer 1. Further, since a carrier concentration is low in the regions between the emitter layer 5 and the base layer 3, and between the base layer 3 and the collector layer 1, the potential against the carrier is maintained at a high level. Since the high potential region acts as a barrier to carriers these regions are denoted as the barrier layers 4 and 2.

The barrier height of the barriers 4 and 2 can be determined by the difference in the superconducting carrier concentrations thereof.

On the other hand, the barrier height in a conventional superconducting transistor can be mainly determined by a heterointerface between a semiconductor or a insulator and a superconducting metal.

Therefore, the present invention has a feature superior to that of the prior art in that, to control the barrier height, a value of a carrier concentration *can be* changed. Thus the controllability of the barrier height in the present invention is superior to that of the prior art. Furthermore, since oxide superconductors having a larger superconducting energy gap are used in the present invention, a higher barrier height can be advantageously used between the base layer 3 and the collector layer 1 than where a conventional low temperature superconductor is used. This is because it is easier to control high barrier than to control low barrier.

Figure 4:
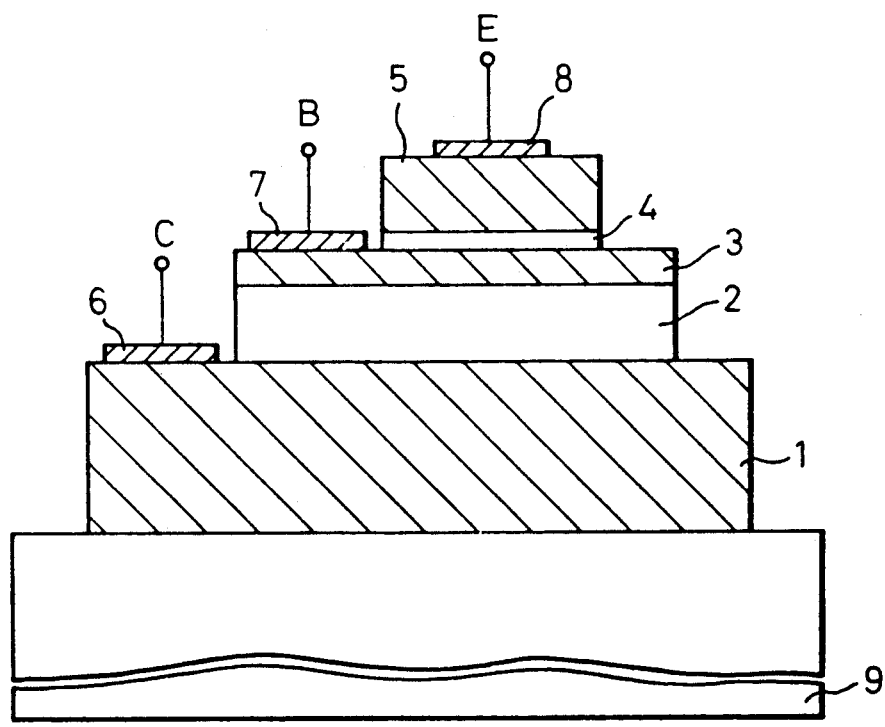

FIG. 4 is a main portion of a cross-sectional view of an example of the present invention.

In FIG. 4 the same reference numerals denote the same portions and have the same meanings as in FIGS. 2 and 3.

As shown in FIG. 4, an insulating layer 9 of MgO, a collector layer 1 of $(La_{0.925}Sr_{0.075})_2CuO_4$ having a thickness of 400 nm, a barrier layer 2 of $(La_{0.96}Sr_{0.04})_2$ having a thickness of 200 nm, a base layer 3 of $(La_{0.925}Sr_{0.075})_2CuO_4$ having a thickness of 100 nm, a barrier layer 4 of $La_2CuO_4$ having a thickness 10 nm, and an emitter layer 5 of $(La_{0.025}Sr_{0.075})_2CuO_4$ having a thickness of 200 nm are provided. Even though Sr is contained in the barrier layer 4, the barrier layer acts as a barrier. The small content of Sr is preferable. In a case of $(La_{1-x}Sr_x)$ it exhibits a superconducting property at $x \geq 0.05$, and a semiconducting property at $x < 0.05$.

A collector electrode 6, a base electrode 7 and an emitter electrode 8 are also provided and are formed of Au and have a thickness of 1 $\mu$m.

In this example, the composition of $(La_{0.96}Sr_{0.004})_2CuO_4$ forming the collector layer 1, the base layer 3, and the emitter layer 5 exhibit a superconducting property at an operating temperature.

On the other hand the composition of $(La_{0.96}Sr_{0.004})_2CuO_4$ forming the barrier layer 2 and of $La_2CuO_4$ forming the barrier layer 4 do not exhibit a superconducting property at an operating temperature.

Whether or not a $(La_{1-x}Sr_x)$ exhibits the superconducting property at an operating temperature is determined by carrier concentrations due to the compositions of $La_{1-x}Sr_x$ (x is changeable from 0 to 1).

If a $Ba_2YCu_3O_x$ is used as an oxide superconductor the carrier concentration thereof can be changed merely by changing the amount x of oxygen. Namely, when about 6.7 to 6.8 of the values x of the compound of $Ba_2YCu_3O_x$ is selected, the compounds of $Ba_2YCuO_x$ exhibit a superconducting property, and when about 6.4 or less of the value x thereof is selected they exhibit a semiconducting (not superconducting) property.

Further, a compound of BiSrCaCuO having each atom ratio of 2:2:0:1:6 has a critical temperature (Tc) of about 10 [K].

In an atom ratio of 2:2:1:2:8, the critical temperature Tc thereof is about 80 [K], and in the ratio of 2:2:2:3:10 the critical temperature Tc thereof is about 110 [K]. Therefore, when, for example, a compound of $Bi_2Sr_2Ca_2Cu_3O_{10}$ having a carrier concentration of $3\times10^{21}$/cm at a temperature of, for example, 120 K as a collector, a base and an emitter, a compound of $Bi_2Sr_2CaCu_2O_8$ having a carrier concentration of $3\times10^{21}$/cm$^3$ used as a first and a second barrier layer.

When a metal Nb having a carrier concentration of $1\times10^{23}$/cm$^3$ is used as a superconductor the critical temperature Tc is about 9.2 [K].

Metal usually has a carrier concentration of about $1\times10^{23}$cm$^3$.

In the superconducting transistor according to the present invention, an emitter layer, a base layer and a collector layer, and barrier layers therebetween, are formed of substantially the same substance, and therefore, the technical problems which arise when a heterojunction is formed can be ignored. Further, since an electrical barrier is not generated between each layer, particularly the base and a collector layers, a superconducting transistor having improved properties such as a large current transmitting rate can be reproducibly obtained.

I claim:

1. A superconducting transistor comprising:
   an oxide superconducting collector layer for drawing out quasi-particles from an oxide superconducting base layer while a carrier concentration is maintained at a level lower than in metal and at a high level where the superconducting property is exhibited, said oxide superconducting collector layer being formed of predetermined component elements which are formed in a predetermined composition ratio;
   a first oxide barrier layer provided on said oxide superconducting collector layer, formed of a substance having the same component elements as that of said oxide superconducting collector layer and having a different composition ratio than that of said oxide superconducting collector layer, and said first oxide barrier layer having a low carrier concentration wherein the superconducting property is not exhibited;
   said oxide superconducting base layer provided on said first oxide barrier layer, formed on a substance having the same component elements as that of said oxide superconducting collector layer, having a different composition ratio than that of the first oxide barrier layer and having a high carrier concentration where the superconducting property is exhibited;
   a second oxide barrier layer provided on said oxide superconducting base layer formed of a substance having the same component elements as that of said oxide superconducting collector layer, having a different composition ratio than that of said oxide superconducting collector layer and having a low carrier concentration where the superconducting property is not exhibited; and
   an oxide superconducting emitter layer provided on said second barrier layer, formed of a substance having the same component elements as that of said oxide superconducting collector layer, having a different composition ratio than that of said first and second oxide barrier layers and having a high carrier concentration where the superconducting property is exhibited.

2. A superconducting transistor according to claim 1, wherein said oxide superconducting collector layer is at least one of $(La_{1-x}Sr_x)_2CuO_4$ where x is greater than about 0.05, and $Ba_2YCu_3O_x$ where x is about 6.7 to 6.8, and has a carrier concentration of $2\times10^{21}$ to $2\times10^{22}$cm$^3$ at a predetermined operating temperature.

3. A superconducting transistor according to claim 1, wherein said oxide superconducting base layer is at least one of $(La_{1-x}Sr_x)_2CuO_4$ where x is greater than about 0.05, and $Ba_2YCu_3O_x$ where x is about 6.7 to 6.8, and has a carrier concentration of $2\times10^{21}$ to $2\times10^{22}$/cm$^3$ at a predetermined operating temperature.

4. A superconducting transistor according to claim 1, wherein said oxide superconducting emitter layer is at least one of $(La_{1-x}Sr_x)_2CuO_4$ where x is greater than about 0.05, and $Ba_2YCu_3O_x$ where x is about 6.7 to 6.8, and has a carrier concentration of $2\times10^{21}$ to $2\times10^{22}$/cm$^3$ at a predetermined operating temperature.

5. A superconducting transistor according to claim 1, wherein said first oxide barrier layer is at least one of $(La_{1-x}Sr_x)_2CuO_4$ where x is less than about 0.05, and $Ba_2YCu_3O_x$ where x is about 6.4 or less, and has a carrier concentration of less than $2\times10^{21}$/cm$^3$ at a predetermined operating temperature.

6. A superconducting transistor according to claim 1, wherein said second oxide barrier layer is at least one of $(La_{1-x}Sr_x)_2CuO_4$ where x is less than about 0.05, and $Ba_2YCu_3O_x$ where x is about 6.4 or less, and has a carrier concentration of less than $2\times10^{21}$/cm$^3$ at a predetermined operating temperature.

7. A superconducting transistor according to claim 1, wherein said oxide superconducting collector, base, and emitter layers are $(La_{0.925}Sr_{0.075})_2CuO_4$ and said first and second oxide barrier layers are $(La_{1-x}Sr_x)_2CuO_4$, where $x<0.05$.

8. A superconducting transistor according to claim 1, wherein said oxide superconducting collector, base and emitter layers are $Ba_2YCu_3O_{6.7 \text{ to } 6.8}$ and said first and second oxide barrier layers are $Ba_2YCu_3O_{6.0 \text{ to } 6.4}$.

* * * * *

UNITED STATES PATENT AND TRADEMARK OFFICE
CERTIFICATE OF CORRECTION

PATENT NO. : 5,106,822
DATED : April 21, 1992
INVENTOR(S) : Hirotaka Tamura

It is certified that error appears in the above-identified patent and that said Letters Patent is hereby corrected as shown below:

Title Page, Section [54], change "BASE," to --BASE--; and
Section [56], line 11, change "Tetragonal Orthorhmbic" to --Tetragonal-Orthorhombic--.

Column 1, Title, change "BASE," to --BASE--;
line 41, change "In $Al_{0.14}Ga_{0.86}$)" to --In($Al_{0.14}Ga_{0.86}$)--; and
line 44, change "5 x 3" to --5 x $10^{17}/cm^3$--.

Column 2, line 43, after "exhibited" insert a comma;
line 46, change "rate.," to --rate;--; and
line 64, after "exhibited" delete the comma.

Column 3, line 20, after "and" delete the comma; and
line 58, after "element" insert --property--.

Column 4, line 34, change "$(La_{0.96}Sr_{0.04})_2$" to --$(La_{0.96}Sr_{0.04})_2CuO_4$--;
line 42, change "$(La_{1-x}Sr_x)$" to --$(La_{1-x}Sr_x)_2CuO_4$--; and
line 51, change "$Sr_{0.004}$" to --$Sr_{0.04}$--.

Column 5, line 9, change "cm" to --$cm^3$ is used--;
line 12, after "$cm^3$" insert --can be--;
line 17, change "$10^{23}cm^3$" to --$10^{23}/cm^3$--; and
line 47, change "wherein" to --where--.

UNITED STATES PATENT AND TRADEMARK OFFICE
CERTIFICATE OF CORRECTION

PATENT NO. : 5,106,822

DATED : April 21, 1992

INVENTOR(S) : HIrotaka Tamura

It is certified that error appears in the above-identified patent and that said Letters Patent is hereby corrected as shown below:

Column 6, line 22, change "$10^{23} cm^3$" to --$10^{23}/cm^3$--.

Signed and Sealed this

Twentieth Day of July, 1993

Attest:

MICHAEL K. KIRK

Attesting Officer     Acting Commissioner of Patents and Trademarks